(12) United States Patent
Rahm et al.

(10) Patent No.: US 9,911,074 B2
(45) Date of Patent: Mar. 6, 2018

(54) SECURITY ELEMENT FOR VALUE DOCUMENTS

(71) Applicant: GIESECKE & DEVRIENT GMBH, Munich (DE)

(72) Inventors: Michael Rahm, Bad Tolz (DE); Manfred Heim, Bad Tolz (DE); Andreas Rauch, Waakirchen (DE); Jurgen Schutzmann, Pfaffenhofen (DE); Winfried Hoffmuller, Bad Tolz (DE)

(73) Assignee: GIESECKE+DEVRIENT CURRENCY TECHNOLOGY GMBH, Munich (DE)

( * ) Notice: Subject to any disclaimer, the term of this patent is extended or adjusted under 35 U.S.C. 154(b) by 25 days.

(21) Appl. No.: 14/781,658

(22) PCT Filed: Apr. 4, 2014

(86) PCT No.: PCT/EP2014/000912
§ 371 (c)(1),
(2) Date: Oct. 1, 2015

(87) PCT Pub. No.: WO2014/161674
PCT Pub. Date: Oct. 9, 2014

(65) Prior Publication Data
US 2016/0042265 A1    Feb. 11, 2016

(30) Foreign Application Priority Data

Apr. 4, 2013    (DE) .................. 10 2013 005 839

(51) Int. Cl.
*G06K 7/08* (2006.01)
*G06K 19/06* (2006.01)
(Continued)

(52) U.S. Cl.
CPC ....... *G06K 19/06196* (2013.01); *B42D 25/29* (2014.10); *G03F 7/32* (2013.01);
(Continued)

(58) Field of Classification Search
CPC ....... G06K 19/06187; G06K 19/06196; G06K 7/084; G06K 7/087; G06K 1/121;
(Continued)

(56) References Cited

U.S. PATENT DOCUMENTS 5,807,456 A    9/1998 Kaule
6,053,406 A *  4/2000 Litman .................. G06K 7/084
                                                    235/449
(Continued)

FOREIGN PATENT DOCUMENTS

DE    4211235 A1    12/1993
DE    19650759 A1   6/1998
(Continued)

OTHER PUBLICATIONS

German Search Report for corresponding German Application No. 102013005839.2, dated Oct. 18, 2013.
(Continued)

*Primary Examiner* — Thien M Le
*Assistant Examiner* — April Taylor
(74) *Attorney, Agent, or Firm* — Workman Nydegger

(57) ABSTRACT

The invention concerns a security element having a magnetic coding consisting of magnetic coding elements. At least one of the magnetic coding elements has a grid-shaped magnetic region which is formed by a plurality of mutually parallel grid strips made of magnetic material which respectively have a magnetic anisotropy. The grid strips lead, through their magnetic anisotropy, to the magnetization direction of the coding element being able to differ from the direction of the applied magnetic field. Since the resultant (Continued)

magnetic signals that the grid-shaped magnetic regions deliver cannot be simulated by conventional magnetic regions, said coding elements increase the anti-forgery security of the security element.

15 Claims, 4 Drawing Sheets

(51) Int. Cl.
| | |
|---|---|
| *G07D 7/04* | (2016.01) |
| *B42D 25/29* | (2014.01) |
| *G07D 7/004* | (2016.01) |
| *G03F 7/32* | (2006.01) |
| *G06K 1/12* | (2006.01) |

(52) U.S. Cl.
CPC .............. *G06K 1/121* (2013.01); *G06K 1/125* (2013.01); *G06K 7/087* (2013.01); *G07D 7/004* (2013.01); *G07D 7/04* (2013.01); *B42D 2033/16* (2013.01); *G06K 19/06187* (2013.01)

(58) Field of Classification Search
CPC .......... G06K 1/125; G07D 7/04; G07D 7/004; B42D 25/29; B42D 25/30; B42D 25/355; B42D 25/36; B42D 25/369
See application file for complete search history.

(56) References Cited

U.S. PATENT DOCUMENTS

| | | | | |
|---|---|---|---|---|
| 6,146,773 | A * | 11/2000 | Kaule | ..................... D21H 21/48 |
| | | | | 235/493 |
| 6,343,745 | B1 | 2/2002 | Bohm et al. | |
| 6,454,166 | B1 * | 9/2002 | Stenzel | ................ B42D 25/355 |
| | | | | 235/382 |
| 8,123,138 | B2 | 2/2012 | Schutzmann et al. | |
| 8,276,826 | B2 | 10/2012 | Schutzmann et al. | |
| 8,387,879 | B2 * | 3/2013 | Schutzmann | ............ G07D 7/04 |
| | | | | 235/435 |
| 8,544,893 | B2 * | 10/2013 | Schutzmann | .......... G06K 19/12 |
| | | | | 162/140 |
| 8,910,869 | B2 | 12/2014 | Schutzmann et al. | |
| 8,964,296 | B2 | 2/2015 | Hoffmuller et al. | |
| 2007/0018004 | A1 | 1/2007 | Gurovich | |
| 2010/0052307 | A1 | 3/2010 | Schutzmann et al. | |
| 2012/0118961 | A1 | 5/2012 | Schutzmann et al. | |
| 2013/0063826 | A1 | 3/2013 | Hoffmuller et al. | |
| 2013/0082105 | A1 | 4/2013 | Schutzmann et al. | |

FOREIGN PATENT DOCUMENTS

| | | |
|---|---|---|
| DE | 102006055169 A1 | 5/2008 |
| DE | 102010019766 A1 | 11/2011 |
| DE | 102011106263 A1 | 12/2011 |
| EP | 1172806 A1 | 1/2002 |
| EP | 2039729 A2 | 3/2009 |

OTHER PUBLICATIONS

International Preliminary Report on Patentability for corresponding International PCT Application No. PCT/EP2014/000912, dated Oct. 6, 2015.

International Search Report for corresponding International PCT Application No. PCT/EP2014/000912, dated Jul. 23, 2014.

* cited by examiner

SECURITY ELEMENT FOR VALUE DOCUMENTS

BACKGROUND

This invention concerns a security element for safeguarding value documents.

SUMMARY

From the prior art it is known to equip value documents with security elements, such as security strips or also security threads, which contain magnetic material. The magnetic material can be applied to the security element continuously or in some regions, for example in the form of a magnetic coding. For magnetically coding a security thread there is used for example a certain sequence of magnetic and non-magnetic regions which is characteristic of the kind of value document to be secured. Moreover, it is known to employ different magnetic magnet materials for a coding, for example magnet materials having different coercive field strength. Usual magnetic codings of a security element consist of coding elements which are formed by high- or low-coercivity magnetic regions which are arranged on the security element in a certain manner. The high- and low-coercivity magnetic regions are usually formed by magnetically hard magnet materials which have a great remanent magnetization even without the action of a magnetic field. Said coding elements consisting of magnetic regions applied to the security element continuously areally will hereinafter be designated conventional coding elements.

The invention is based on the object of stating a possibility of magnetically coding a security element that offers a greater anti-forgery security.

This object is achieved by the subject matter of the independent claims. Developments are the subject matter of the subclaims.

The security element according to the invention is a machine-readable security element which has a magnetic coding consisting of one or more magnetic coding elements. At least one of the magnetic coding elements has a grid-shaped magnetic region which is formed by a plurality of mutually parallel grid strips made of magnetic material. Said grid strips of the magnetic coding element respectively have a magnetic anisotropy whose preferential magnetic direction extends along the grid strips, in particular a magnetic shape anisotropy. However, the magnetic anisotropy can also be obtained or strengthened by other anisotropic effects.

An advantage of the coding element having a grid-shaped magnetic region consisting of grid strips with magnetic anisotropy is the fact that there can be obtained by the magnetically anisotropic grid strips another magnetization direction than is possible with a conventional magnetic region. While in conventional coding elements the magnetization always extends parallel to the applied magnetic field, the grid strips lead, through their magnetic anisotropy, to the magnetization direction of the coding element being able to differ from the direction of the applied magnetic field. Through the magnetic anisotropy of the grid strips it is achieved that a magnetic field that is applied at an acute angle to the grid strips of the magnetic coding element for magnetizing the magnetic coding elements leads to a magnetization of the respective magnetic coding element that has both a magnetization component parallel to the applied magnetic field and a magnetization component perpendicular to the applied magnetic field.

The resultant magnetic signals that the grid-shaped magnetic regions deliver cannot be simulated by conventional magnetic regions. The coding elements having a grid-shaped magnetic region hence increase the anti-forgery security of the security element having one or more of said coding elements.

Furthermore, the grid-shaped magnetic regions have the advantage over conventional magnetic regions that they can be better integrated into the design of a security element or into the value-document design. Since conventional magnetic regions manufactured by printing magnetic ink have the black color of the magnetic ink, they are usually covered by an opaque layer in order to be invisible to the eye. The grid-shaped magnetic region or regions according to the invention do not appear black, however, but can appear metallically lustrous or also appear in a strip shape, depending on the manufacturing method and in dependence on the chosen grid properties. Both the metallically lustrous and the strip-shaped appearance of the coding element according to the invention can be employed as part of the value-document design.

For example, the security element according to the invention has a grid-shaped magnetic region whose outline corresponds to a motif that is part of the design of the security element or part of the value-document design. The outline can correspond to a geometrical object, e.g. a circle or a polygon, or also a free form provided in the design. The security element according to the invention can also have further regions suitable for visual verification of the security element or be combined with security elements provided for visual verification.

In particular, the magnetic coding has two or more than two magnetic coding elements which are arranged along a coding direction on or in the security element. The coding direction is that direction along which the coding elements are arranged on the security element. Said coding direction is usually the longitudinal direction of the security element. The longitudinal direction of the security element refers here to the direction in which the security element possesses its greatest extension. There can be provided one or more parallel rows with two or more than two coding elements.

The coding elements preferably have a minimum distance apart along the coding direction, in order to be detectable separately from each other using a spatially resolving magnetic sensor. It is thereby achieved that the arrangement of the coding elements on the security element can be detected with great reliability. In particular, the distance between the respectively adjacent coding elements of the security element amounts (for all coding elements) to at least 50% of the length of the shortest coding element that the security element has along the coding direction, preferably at least 100% of the length of the shortest coding element. For example, the distance between the respectively adjacent coding elements amounts to at least 2 mm.

The security element preferably has in its magnetic coding two or more coding elements having the same coercive field strength. The length of said coding elements along the coding direction can be like or different. Said coding elements can be immediately adjacent to each other or be mutually separated by other coding elements and/or non-magnetic regions. Through the same coercive field strength it is achieved that said coding elements show like behavior as nearly as possible upon a remagnetization by an external magnetic field. This simplifies the detection of the coding elements. However, the coding elements can of course be mutually distinguished using a spatially resolved detection.

For example, the security element has in its magnetic coding at least two like coding elements that do not mutually differ in their magnetic properties.

The grid strips of the coding element extend in particular at an acute angle to the coding direction, in particular to the longitudinal direction, of the security element. Preferably, said acute angle amounts to between 20° and 70°, particularly preferably between 30° and 60°. Since for magnetizing the security element it is usual to apply a magnetic field perpendicular or parallel to the coding direction of the security element, there is thus obtained an acute angle between the grid strips and the magnetization direction in both cases, i.e. both with a magnetic field perpendicular to the coding direction and with a magnetic field parallel thereto. The magnetic coding of the security element can thus be read by different magnetic detectors employing different magnetization directions and be distinguished from conventional magnetic codings.

For example, the security element has at least a first and at least a second magnetic coding element along the coding direction. The first and second magnetic coding elements respectively have a grid-shaped magnetic region which is formed by a plurality of mutually parallel grid strips made of magnetic material. The grid strips of the first coding element and the grid strips of the second coding element are respectively configured such that they have a magnetic anisotropy. The grid strips of the magnetic coding element, in particular the grid strips of the first/second coding element, respectively extend substantially parallel to each other. The grid strips of every first coding element extend substantially parallel to the grid strips of the other first coding element or elements. The grid strips of every second coding element extend substantially parallel to the grid strips of the other second coding element or elements.

For example, the grid strips of the respective coding element are respectively configured continuously straight. To employ the respective coding element as part of the security-element design or value-document design, however, other variants of grid strips can also be employed: For example, the grid strips can be of slightly wavy configuration. The individual grid strips can also have one or more interruptions in which the magnetic material is absent. Within a coding element the grid strips can also be formed by a plurality of short lines made of magnetic material which respectively lie slightly offset from each other, but extend substantially parallel to each other. The grid period of the grid strips within a coding element (or also the grid period of the different coding elements) can also vary. The only important thing is that the grid strips within the respective magnetic region of the coding element point substantially in the same direction. This also comprises that there can be a slight tilt of the individual grid strips relative to each other. However, the angle of the tilt of the grid strips preferably amounts to at most 10°.

The magnetic coding of the security element can also have two or more first/second coding elements that are arranged along the coding direction on or in the security element, without a second/first coding element with a grid-shaped magnetic region also being present in the coding.

In particular, the magnetic coding of the security element can have two or more than two different coding elements having differently configured grid-shaped magnetic regions e.g. with different orientation of the grid strips. In a preferred exemplary embodiment, the magnetic coding of the security element has at least a first magnetic coding element and at least a second magnetic coding element, with the grid strips of the second magnetic coding element extending in another direction than the grid strips of the first magnetic coding element. For example, the first and second grid-shaped magnetic regions are of like construction and only the orientation of the grid strips is different. Alternatively, there can also be employed for the first and the second coding element different grids, e.g. different periods, different thicknesses and/or widths of the grid strips, different magnetic material for the grid strips, etc.

If the same magnet material is employed for the first and the second coding element and only the grid parameters (e.g. direction, period, width) of the respective grid strips is different, different coding elements do not require separate process steps, but can be manufactured simultaneously by the same process steps.

In one exemplary embodiment, the grid strips of the coding element, in particular of the first and the second coding element, respectively extend at an acute angle to the coding direction (e.g. longitudinal direction) of the security element, in particular at an angle between 20° and 70°, preferably between 30° and 60°, e.g. about 45°. Said angles are especially well suited for a machine check of the security element upon which the security element is magnetized by a magnetic field extending perpendicular or parallel to the coding direction of the security element. For in this case the resultant magnetization of the coding element having the grid-shaped magnetic region differs strongly from the resultant magnetization of a conventional coding element.

Preferably, the grid strips of the second magnetic coding element extend at an angle between 60° and 120° to the grid strips of the first magnetic coding element, preferably at an angle between 70° and 110°, for example at an angle of about 90°. Said angles between the grid strips have the advantage that the same magnetization magnetic field brings about a distinctly different magnetization of the first and the second coding element.

In particular, the width and also the thickness that the magnetic material of the grid strips, e.g. of the first magnetic coding element and of the second magnetic coding element, has is chosen so small that the grid strips, in particular the first and second grid strips, respectively have a magnetic shape anisotropy. Said shape anisotropy leads to the grid strips having a preferential magnetic direction along the longitudinal direction of the grid strips. At a macroscopic width and thickness of the grid strips, in contrast, the magnet materials have no shape anisotropy. However, if the width and also the thickness are microscopically small, e.g. lie in the order of magnitude of the exchange length $l_{ex} = \sqrt{(A/K_D)}$ of the magnetic material of the respective grid strips (where A is the exchange integral A and $K_D$ is the stray-field energy coefficient), there results a shape anisotropy with a preferential magnetic direction along the longitudinal direction of the grid strips. To obtain a sufficiently great magnetic shape anisotropy, the width of the grid strips preferably respectively amounts to at most 5 µm. The width of the grid strips preferably lies between 100 nm and 5 µm, in particular between 100 nm and 1 µm. The thickness of the grid strips is e.g. smaller than 1 µm. The ratio between the length of the respective grid strip and the width (or the thickness) of the respective grid strip preferably amounts to at least 3:1, in particular at least 5:1, preferably at least 10:1.

The magnetic anisotropy of the grid strips leads—without an applied magnetic field—to a remanent magnetization of the respective coding element along a direction extending parallel to the grid strips of the respective coding element, with a negligibly small remanent magnetization of the grid strips being obtained perpendicular to the grid strips. Through the magnetic anisotropy of the grid strips it is achieved that a magnetic field that, for magnetizing the respective coding element, is applied at an acute angle to the grid strips of the respective coding element leads to a remanent magnetization of the respective coding element according to a magnetization vector having both a magnetization component parallel to the applied magnetic field and a magnetization component perpendicular to the applied magnetic field (which are both different from zero). For example, the magnetization component perpendicular to the applied magnetic field amounts to at least 20% of the magnetization component parallel to the applied magnetic field.

In contrast, conventional magnetic regions are always only magnetized in the direction parallel to the applied magnetic field due to their isotropic magnetic properties. Their remanent magnetization hence has no component extending perpendicular to the applied magnetic field.

The magnetic anisotropy, in particular shape anisotropy, of the grid strips of the magnetic coding element, in particular of the first and/or second coding element, is preferably configured such that the magnetic coding element, in particular the first and/or second magnetic coding element, has in the magnetization direction parallel to the grid strips a magnetization characteristic with an open hysteretic shape, and has in the magnetization direction perpendicular to the grid strips a magnetization characteristic having a negligibly small remanent magnetization, in comparison to the magnetization characteristic parallel to the grid strips. The remanent magnetization of said magnetization characteristic is preferably at least a factor of 5 smaller than the remanent magnetization of the magnetization characteristic with an open hysteretic shape that the coding element has in the direction parallel to the grid strips. For example, the magnetization characteristic that the magnetic coding element has perpendicular to the grid strips extends substantially linearly and has a nearly closed course, although other curve shapes are also possible.

The magnetic anisotropy, in particular shape anisotropy, of the grid strips is in particular so formed that the magnetization characteristic with an open hysteretic shape that the magnetic coding element has in the magnetization direction parallel to the grid strips has a coercive field strength of at least 10 Oe (0.796 kA/m), preferably at least 50 Oe (3.98 kA/m), and the magnetization characteristic that the magnetic coding element has in the magnetization direction perpendicular to the grid strips has a negligibly small coercive field strength, in comparison therewith.

In a special variant, the grid strips cause no visually perceptible light diffraction in the visible spectral region. For this purpose, the period of the grid strips of the respective magnetic region is e.g. chosen accordingly small, the period of the grid strips amounting for example to less than 400 nm. For suppressing a visually perceptible light diffraction, the individual grid strips can also be slightly tilted relative to each other, and/or the grid period be varied, within the respective coding element.

The grid-shaped magnetic regions of the coding element can also be integrated into the security element or into the value document such that they are invisible upon viewing of the value document by eye. For example, the grid-shaped magnetic regions are not located on the surface but rather in the interior of the security element or of the value document. The grid-shaped magnetic regions are e.g. covered on one or both sides by one or more further opaque plies of material of the security element or of the value document.

The security element can be checked using a magnetic sensor which detects magnetic signals of the security element. The magnetic coding of the security element can be checked using a spatially resolving magnetic sensor. For magnetizing the magnetic coding elements, there acts on the security element before detection (and, where applicable, also during detection) of the magnetic signals a magnetic field whose direction extends at an acute angle to the grid strips of the magnetic coding element. The acute angle preferably amounts to between 30° and 60°. The magnetic signal of the security element is then characteristic of the anisotropic magnetizability of the magnetic coding elements. In the magnetic signal there thus appears a distinct difference over conventional coding elements.

Preferably, the value-document region in which the security element is located is scanned two-dimensionally upon detection of the magnetic signals. In so doing, the magnetic signal is detected, at least in the region of the security element, along two different directions as a function of the position on the value document. Preferably, the magnetic signal of the security element is evaluated as a function of the coding direction of the magnetic coding (e.g. as a function of the longitudinal direction of the security element). The magnetic signal is evaluated in those regions of the security element where the differences of the different coding elements, in particular the differences over conventional coding elements, distinctly emerge. This depends on the direction of the applied magnetic field, on the direction of the grid strips and on the sensitivity direction of the magnetosensitive elements. For example, the magnetic signals of the edges of the coding elements are evaluated.

For manufacturing the grid-shaped magnetic regions there are different possibilities. It is preferred to apply the magnetic material to a security-element substrate using—instead of a printing method—a coating method wherein a coating made of magnetic material is deposited on the security-element substrate. The coating method involves e.g. applying a magnetic metal layer to a security-element substrate. The applied magnetic coating, in particular magnetic metal layer, is structured to a grid-shaped magnetic region, e.g. by selective demetallization of the interstices between the grid strip or by incorporating uneven areas with the aid of a surface relief which is incorporated into the substrate before or after the magnetic layer.

One advantage of the coating method in comparison to the hitherto usual printing of the magnetic layer is that the layer thickness and hence also the remanent magnetization of the magnetic layer is distinctly better controllable. For the layer thickness to be applied can be easily controlled in such coating methods. In contrast, the remanent magnetization is only inexactly adjustable in the case of printed magnetic regions, since amount/concentration of the magnetic material is subject to great fluctuations, for manufacturing reasons. Another advantage is that the layer thickness of the grid-shaped magnetic regions according to the invention is substantially smaller than the layer thickness that is necessary—at a comparable signal strength of the magnetic signal—for conventional magnetic regions applied by a printing method. Hence, it is also possible to equip e.g. foil elements with a magnetic coding according to the invention without having to accept an excessive thickness of the foil element.

The magnetic printing pigments hitherto employed for manufacturing magnetic coding elements moreover have an unchangeable coercive field strength, since this is an uninfluenceable material parameter of the respective printing pigment. The coding elements according to the invention have the advantage, in contrast, that the coercive field strength is adjustable in the manufacturing method, by choice of the grid parameters, e.g. grid period or width of the grid strips. Thus, magnetic regions with different coercive field strengths can be manufactured from the same magnet material, in dependence on the chosen grid parameters.

The magnetic coating from which the grid strips are formed is preferably manufactured using a thin-film technology coating method, e.g. by means of thermal evaporation or electron-beam evaporation or sputtering in a vacuum apparatus, or by CVD (chemical vapor deposition) or PECVD (plasma enhanced chemical vapor deposition) or by electrochemical deposition from a liquid.

The magnetic coating that is applied in the coating method contains e.g. iron, cobalt, nickel or alloys of said metals. Said alloys can also contain Gd, B, Nd, Mo, Sm, Nb, etc. A suitable magnetic material is e.g. permalloy (approx. 80% Ni, 20% Fe). In the coating method there can also be applied layer systems consisting of different magnetic and non-magnetic layers.

The grid-shaped magnetic regions can be manufactured e.g. by one of the following methods:

a) In one preferred manufacturing method, a magnetic coating is applied to an existing grid-shaped surface relief which is present in a layer of a security element. Both on the raised places of the grid-shaped surface relief and in the depressions of the grid-shaped surface relief there form strip-shaped magnetic regions. The grid-shaped surface relief can have been manufactured by means of embossing, e.g. embossing into UV-curable lacquer, or also using other methods.

For example, grid strips are embossed into a layer 82 present on a substrate 81, cf. FIG. 8a. Through the magnetic coating of the embossed substrate there form magnetic regions 83 on the raised places of the embossed layer 82 and magnetic regions 84 in the depressions thereof. Both the magnetic regions 83 and the magnetic regions 84 form a grid-shaped magnetic region whose grid strips respectively have a magnetic anisotropy. FIG. 8b shows for one of the grid strips by way of example its width b and thickness d. Both the grid strips 83 and the grid strips 84 contribute to the anisotropic magnetization of the respective coding element. Since altogether more grid strips are present in the thus manufactured coding element than in a grid with non-magnetic interstices, there advantageously results a greater magnetic signal upon detection.

Depending on the kind of coating technology, it may be that the flanks of the depressions of the surface relief are also coated with magnetic material. This can lead to a connection between the magnetic regions 83 and 84 through magnetic material. However, it has been found that a sufficient magnetic anisotropy of the grid strips can be obtained to achieve the effect according to the invention in this case as well, in particular as long as the layer thickness of the magnet material on the flanks is very small.

To obtain a distinct separation of the individual grid strips, a grid-shaped surface relief consisting of relief structures with a wavy or triangular cross section, e.g. with a sawtooth shape, can be employed (manufacturable e.g. by embossing), and said relief be coated at an oblique angle. As a result, only those flanks of the triangular relief structures are coated with magnetic material that face the direction from which the magnetic material is coming, while the flanks of the triangular relief structures facing away from said direction remain free from magnetic material.

b) In another preferred manufacturing method, the grid-shaped magnetic regions are manufactured by a metal transfer method through which the magnetic coating is structured in a grid shape.

Thus, there is first manufactured in a layer 23 of a first substrate (donor substrate 20 with foil 21) a grid-shaped surface relief, e.g. a grid-shaped embossed structure, which is subsequently coated with magnetic material (in a non-firmly-adhering manner), cf. FIG. 7a. Both on the raised places and on the depressions of the grid-shaped surface relief there thereby form magnetic regions 33 and 34, respectively. A second substrate (acceptor substrate 50 with foil 51) is furnished at the desired places with a bonding-agent layer 53, cf. FIG. 7b. The second substrate 50 is connected to the first substrate 20 (under the action of pressure and elevated temperature, where applicable), whereby the bonding-agent layer 53 of the second substrate comes in contact with the magnetic regions 33 of the raised places. Subsequently, the two substrates 20, 50 are mutually separated again, whereby the magnet material 33 of the raised places remains adhering to the bonding-agent layer 53 and is detached from the first substrate 20 or from the layer 23. On the grid structure of the first substrate there remain the magnetic regions 34 present in the depressions, which form a grid-shaped magnetic region, cf. FIG. 7c. With the second substrate 50, the transferred magnetic regions 33 of the raised places form a further grid-shaped magnetic region whose grid strips are configured complementarily to those of the first substrate 20, cf. FIG. 7d. FIG. 7d shows for one of the grid strips by way of example its width b and thickness d. The grid-shaped magnetic regions of both substrates can be employed for manufacturing security elements according to the invention.

c) A further possibility for manufacturing the grid-shaped magnetic regions consists in first applying an (areal) magnetic coating to an (even) security-element substrate and removing said magnetic coating again in the intermediate regions of the grid strips. The removal of the magnetic coating in the intermediate regions of the grid strips can be carried out by etching or by means of a washing-ink method or using a photoresist lift-off method or a combination of said methods. A further possibility of removing the magnetic coating is by irradiation with a laser. In a special variant, the magnetic coating is removed in the intermediate regions by laser irradiation, with the laser light being directed onto the magnetic coating through rod lenses, which bundle the laser light in the form of grid strips and remove the magnetic coating there.

For removing the intermediate regions of the grid strips by means of etching, a resist layer is applied to the (even) magnetic coating. Said resist layer is structured in a grid shape and serves as an etching mask for etching the magnetic coating. For example, there is applied as a resist a photoresist layer which is partly removed again by a developing bath after local exposure with a grid-shaped pattern. The grid-shaped photoresist regions remaining after developing act as an etching mask for the subsequent etching step in which the magnetic coating is removed in the regions that are not protected with photoresist.

In the washing-ink method, washing ink is printed on a substrate in a grid shape, a magnetic coating applied areally thereto, and subsequently the magnetic coating removed again in the grid-shaped washing-ink regions by washing. Since only the magnetic coating in the regions that were not printed with washing ink remains after washing, there thus arise the grid strips of one or more grid-shaped magnetic regions.

The photoresist lift-off method functions analogously to the washing-ink method, with photoresist being applied instead of washing ink to the substrate. By local exposure there are defined grid-shaped regions in which the photoresist is detached again upon subsequent developing. After developing, the magnetic coating is applied areally, both to the photoresist present in a grid shape and to the interjacent substrate regions. With a solvent the photoresist is removed again in the unexposed regions, with the magnetic coating applied on the photoresist being detached with the photoresist. In the regions lying between the photoresist grid strips there thereby arise the grid strips for the grid-shaped magnetic regions.

d) A further possibility of manufacturing the grid-shaped magnetic regions consists in applying a magnetic coating areally to a substrate of a security element, and embossing said coating. The grid strips of the grid-shaped magnetic regions are manufactured by embossing the magnetic coating. Where applicable, there are also co-embossed further layers which lie above or below the magnetic coating. The magnetic coating can be applied e.g. in the region of a region of the security element where holographic structuring is to be done, before the holographic pattern of the security element is embossed. The grid strips of the grid-shaped magnetic regions can then be co-embossed with the hologram embossing of the holographic pattern.

The grid-shaped magnetic regions manufactured by the methods a)-d) can be covered by further layers. The thus obtained layer buildup can be transferred by transfer lamination to other foil elements or substrates which contain further security elements. An exactly registered transfer lamination is preferred when the grid-shaped magnetic regions are to be arranged in certain regions of the further security element in a targeted manner. For example, the grid-shaped magnetic regions can in this manner be arranged in a targeted manner outside visually visible recesses (cleartext) or in a targeted manner behind hologram structures of the security element.

Instead of a rectangular grid, as shown in FIGS. 7 and 8, other grid shapes can also be employed. For example, there can also be chosen—instead of the rectangular shape—a triangular or wavy cross section of the grid strips or also other cross-sectional shapes.

In those manufacturing methods in which a surface relief is incorporated into the substrate (or into substrate and magnetic layer) before or after the magnetic layer is applied to the substrate, there is obtained a continuous magnetic layer whose grid strips lie on different planes or flanks of the surface relief. The grid strips are then not discrete elements, but rather at least partly linked together (e.g. grid strips offset in a stepped manner and having only a thin material connection). Since they are linked together only slightly, however, the grid strips nevertheless have a magnetic anisotropy. Such a continuous magnetic layer is advantageous with regard to the detection of the magnetic signal, since there is virtually twice the number of grid strips—in comparison to discrete grid strips—which deliver an accordingly higher magnetic signal.

BRIEF DESCRIPTION OF THE DRAWINGS

Hereinafter the invention will be explained by way of example with reference to the following figures. There are shown.

DETAILED DESCRIPTION OF VARIOUS EMBODIMENTS

Figure 1A:
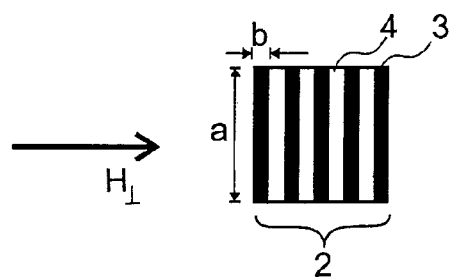
FIGS. 1a-b magnetization of a grid-shaped magnetic region by a magnetic field extending perpendicular to the grid strips (FIG. 1a) or parallel to the grid strips (FIG. 1b), FIG. 1c magnetization characteristic of the grid-shaped magnetic region in the cases of FIGS. 1a and 1b, FIGS. 2a-c first exemplary embodiment of the security element according to the invention (FIG. 2a), its magnetization by a magnetic field $H_x$ (FIG. 2b), and vectorial breakdown of the magnetization (FIG. 2c), FIG. 3a two-dimensional representation of the magnetic signals of the security element from FIGS. 2a-b, detected in the z direction, FIG. 3b course of the magnetic signals detected in the z direction, along the y direction at the position x=x0, FIG. 4 arrangement for checking the magnetic signals of the security element, FIGS. 5a-b second (FIG. 5a) and third (FIG. 5b) exemplary embodiments of the security element according to the invention, FIG. 6 fourth exemplary embodiment of the security element according to the invention, FIGS. 7a-d cross-sectional representations for a first preferred manufacturing method, with the grid strips extending perpendicular to the drawing plane, FIGS. 8a-b cross-sectional representations for a second preferred manufacturing method, with the grid strips extending perpendicular to the drawing plane.

In FIG. 1a is shown an example of a grid-shaped magnetic region 2. It has a plurality of grid strips 3 made of magnetic material and interjacent non-magnetic regions 4. The grid strips 3 have a length a which is preferably at least three times greater than their width b. The width b of the grid strips is e.g. in the μm range or there below. The grid strips have a magnetic shape anisotropy which leads to the grid strips 3 being magnetizable differently in dependence on the magnetic-field direction.

Figure 1B:
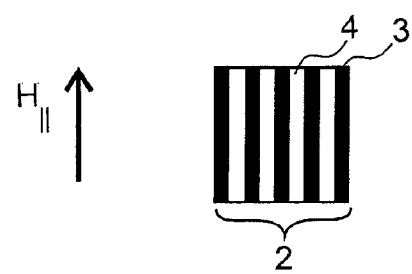

Through a magnetic field $H_\parallel$ extending parallel to the direction of the grid strips 3, cf. FIG. 1b, a magnetization of the grid-shaped magnetic regions 2 is obtained. As a function of the strength of a magnetic field $H_\parallel$ that is applied in the direction parallel to the grid strips, the grid-shaped magnetic region 2 has a magnetization characteristic $M(H_\parallel)$ with an open hysteretic shape which has a coercive field strength $K_\parallel$ of about 200 Oe, cf. FIG. 1c. Even after removal of the grid-shaped magnetic region 2 from the magnetic field $H_\parallel$ there remains a great remanent magnetization $R_\parallel$.

Through a magnetic field $H_\perp$ extending perpendicular to the direction of the grid strips 3, cf. FIG. 1a, the grid-shaped magnetic regions 2 are magnetized distinctly more weakly, in contrast. As a function of the strength of a magnetic field $H_\perp$ that is applied in the direction perpendicular to the grid strips, the grid-shaped magnetic region 2 has a flat and nearly closed, substantially linearly extending magnetization characteristic $M(H_\perp)$ with negligibly smaller coercive field strength $(K_\perp)$, cf. FIG. 1c. After removal of the grid-shaped magnetic region 2 from the magnetic field $H_\perp$ there remains in this case only a negligibly small remanent magnetization $R_\perp$. The latter is preferably at least a factor of 5 smaller than the remanent magnetization $R_\parallel$.

Figure 2A:
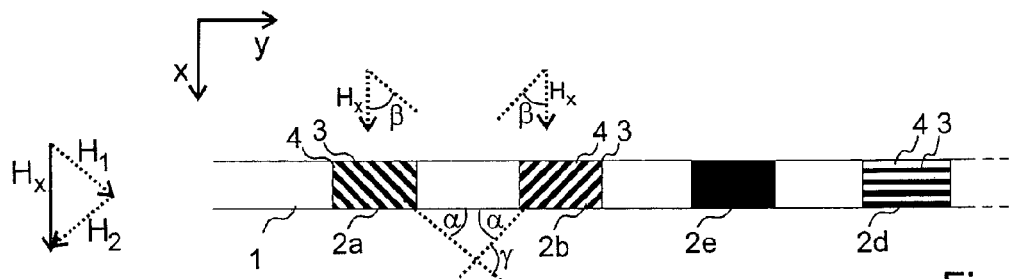

In FIG. 2a is shown a plan view of a security element 1 of a first exemplary embodiment. Along the longitudinal direction y of the security element, the security element 1 has a magnetic coding comprising four different sorts of magnetic coding elements 2a, 2b, 2d, 2e. Between the coding elements 2a-d there is no magnetic material. The coding elements 2a, 2b and 2d respectively have a grid-shaped magnetic region, but with the direction of the grid strips 3 being different in said coding elements. The magnetic coding element 2e has a conventional magnetic region which has no grid strips but rather in which the magnetic material is applied continuously areally. The grid strips 3 of the coding elements 2a and 2b respectively extend at an acute angle α to the longitudinal direction y of the security element 1. Viewed along the longitudinal direction y, the grid strips 3 of the coding element 2a extend to the right and the grid strips 3 of the coding element 2b to the left. In the shown example, the grid strips of the coding element 2b extend approximately perpendicular (y≈90°) to those of the coding element 2a and the two acute angles α amount to approximately 45°. The grid strips 3 of the coding element 2d, in contrast, extend parallel to the longitudinal direction y of the security element 1.

Figure 2B:
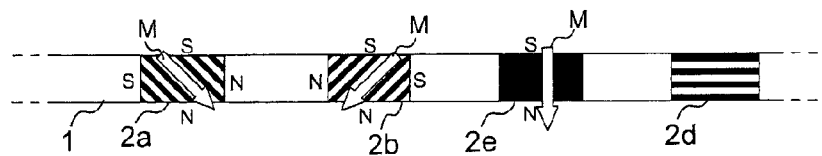

The security element 1 is magnetized e.g. by a magnetic field $H_x$ that is applied along the x direction, i.e. perpendicular to the longitudinal direction y of the security element 1. With the conventional coding element 2e, the magnetic field $H_x$ leads to a magnetization M along the x direction, i.e. parallel to the magnetic field $H_x$. After removal of the security element 1 from the magnetic field $H_x$ there remains with the coding element 2e a remanent magnetization parallel to the previously applied magnetic field $H_x$, which is indicated in FIG. 2b by an arrow on the coding element 2e. In accordance with the remanent magnetization, the magnetized coding element 2e has a magnetic south pole (marked as "S") at one edge (above in FIG. 2b) and a magnetic north pole (marked as "N") at the opposing edge (below in FIG. 2b). In contrast, there results with the coding elements 2a, 2b and 2d having a grid-shaped magnetic region a completely other magnetization behavior.

Figure 1C:
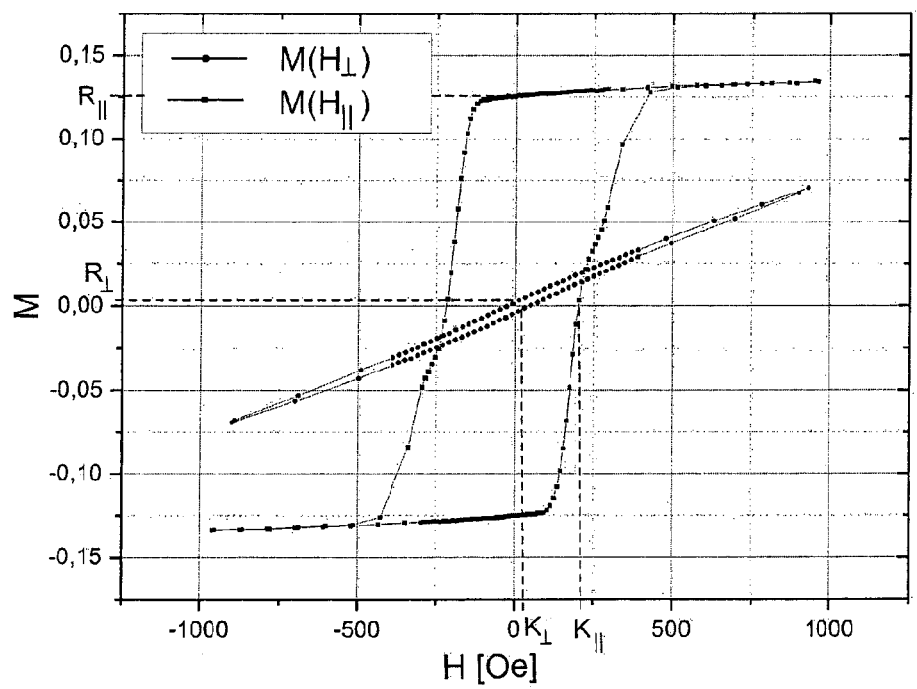

The coding element 2d whose grid strips extend perpendicular to the magnetic field $H_x$ is not magnetized, or magnetized only to a negligibly small degree, in the x direction by the magnetic field $H_x$, in accordance with the magnetization characteristic $M(H_\perp)$ from FIG. 1c. Hence, with said coding element 2d there remains only a negligibly small remanent magnetization (no arrow in FIG. 2b or 2c). Additionally, the security element 1 can also have further coding elements, e.g. a coding element having a grid-shaped magnetic region whose grid strips extend parallel to the magnetic-field direction x. With regard to its magnetization in the x direction, such a coding element behaves qualitatively like the conventional coding element 2e.

The magnetic field $H_x$ can be broken down vectorially into a magnetic-field component $H_1$ extending parallel to the grid strips 3 of the coding element 2a and into a magnetic-field component $H_2$ extending perpendicular to the grid strips 3 of the coding element 2a, cf. FIG. 2a on the left. Due to the magnetic shape anisotropy of the grid strips 3, the coding element 2a is magnetized by the magnetic-field component $H_1$ directed in the direction of the grid strips, while the magnetic-field component $H_2$ directed perpendicular thereto hardly influences or does not at all influence the magnetization M of the coding element 2a. In contrast, the magnetization M of the coding element 2b is hardly or not at all influenced by the magnetic-field component $H_1$, but rather the coding element 2b is magnetized by the magnetic-field component $H_2$. The magnetization of the coding elements (marked with arrow in FIG. 2b) extends both with the coding element 2a and with the coding element 2b along the respective grid strips, i.e. not parallel to the magnetic field $H_x$ but rather at an acute angle to $H_x$. In accordance with the magnetization, the grid strips 3 of the coding elements 2a, 2b respectively have a magnetic north pole at one of their ends and a magnetic south pole at the opposing end. In contrast to the conventional coding element 2e, a magnetic north pole and south pole are formed not only at the upper and lower edges of the coding elements 2a, 2b, but also at the right and left edges of the coding elements 2a, 2b, cf. FIG. 2b.

Figure 2C:
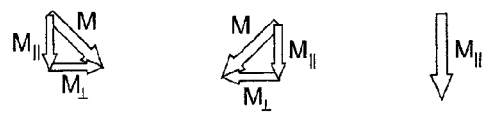

The magnetization M of the coding elements 2a and 2b can be broken down vectorially into a magnetization component $M_\parallel$ parallel to the magnetic field $H_x$ and into a magnetization component $M_\perp$ perpendicular to the magnetic field $H_x$, cf. FIG. 2c. The two coding elements 2a and 2b whose grid strips 3 form an acute angle β to the magnetic field $H_x$ therefore have not only a magnetization component in the direction parallel to the applied magnetic field (x direction), but also a magnetization component perpendicular to the applied magnetic field (y direction). In contrast, the magnetization M of the conventional coding element 2e only has a magnetization component parallel to the applied magnetic field (x direction) and no magnetization component in the direction perpendicular to the applied magnetic field (y direction), cf. FIG. 2c on the right.

After the security element was magnetized by the magnetic field $H_x$, magnetic signals of the security element are detected by a magnetic sensor in order to check the magnetic properties of the security element 1. Depending on the kind of magnetic sensor, a magnetic field can also act on the security element during the detection of the magnetic signals. In the following example it will be assumed that no magnetic field acts on the security element during detection.

Figure 4:
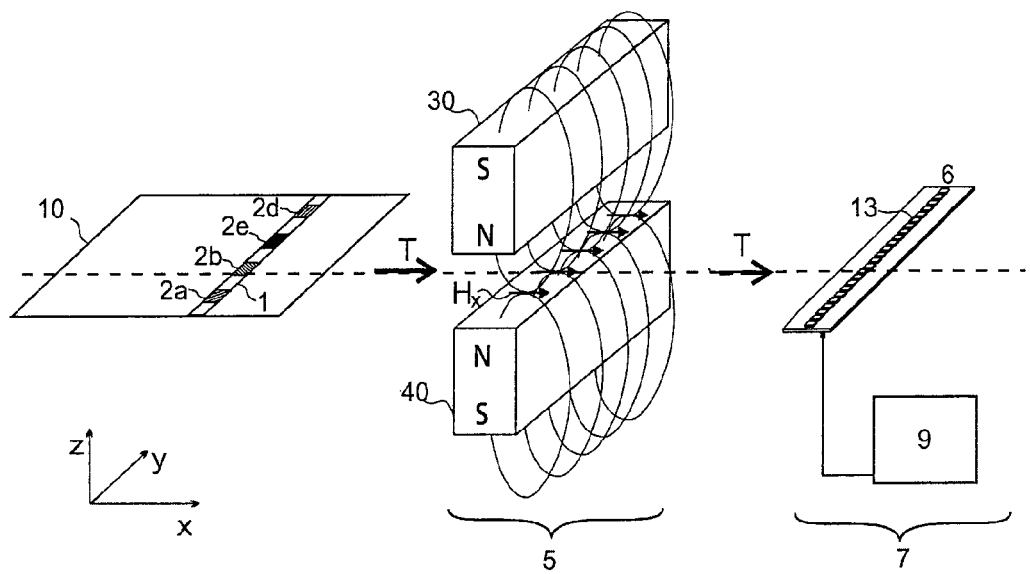

FIG. 4 shows an arrangement for checking the magnetic properties of the security element 1 or of the value document 10. The shown arrangement is contained e.g. in an apparatus for value-document processing to which the value documents 10 are inputted singly or in stacks, subsequently checked, sorted and outputted again or stored in the apparatus for value-document processing. A value document 10 is transported along a transport path T first past a magnetization device 5, for supplying the magnetic field $H_x$, and thereafter past a magnetic sensor 7 having a sensor line 6. The magnetic field $H_x$ is supplied e.g. by two mutually opposing magnets 30, 40 between which the value document 10 is transported through. The poles N, S of the magnets 30, 40 are so aligned that there results therebetween a magnetic field $H_x$ parallel to the transport direction T (x direction). However, other orientations of the magnetic poles are also possible. Alternatively, the first magnetization device 5 can also be arranged only on one side of the transport path S, as long as this achieves a sufficiently great magnetic field strength for magnetizing the magnet material. For example, the magnetic field $H_x$ can also be supplied by only one magnet.

After magnetization by the magnetic field $H_x$, the value document 10 is transported past the magnetic sensor 7 which is installed in the apparatus for value-document processing so as to be spatially separate from the magnetization device 5. Therebetween there can be provided e.g. branchings or deflections of the transport path. The magnetic sensor 7 contains a sensor line 6 having a multiplicity of magnetosensitive elements 13 of the same kind, which are arranged in a line. Each of said magnetosensitive elements 13 delivers a magnetic signal as a function of time or as a function of the x position on the value document 10 transported past. The sensor line 6 is arranged in direct proximity to the transport plane of the value document 10. It can be provided that the value documents 10 transported past touch the surface of the sensor line, but there can also be provided a small distance between the surface of the sensor line 6 and the value document 10 transported past. The magnetosensitive elements 13 are e.g. respectively arranged on a common printed board (details not shown), and connected to an evaluation device 9 which evaluates the magnetic signals of the elements 13.

The value document 10 from FIG. 4 has a security element 1, which in this example is configured as a security thread. However, the invention also concerns other kinds of magnetic security elements of value documents, e.g. foil elements which are applied to the value document and which have a magnetic coding. As an example it is assumed that the security element 1 has the magnetic coding shown in FIG. 2a. The magnetic field $H_x$ is oriented parallel to the transport direction x of the value document 10 and has a sufficient magnetic field strength to magnetize the grid strips 3 of the coding elements 2a, 2b of the security element 1. Through the magnetic field $H_x$ the coding elements 2a-c of the security element 1 are magnetized in accordance with the arrows shown in FIGS. 2b and 2c. Through the sensor line 6 there are detected magnetic signals that correspond to the remanent magnetization of the coding elements 2a-c. By the security element 1 being transported past the sensor line 6, the magnetic signals are detected both as a function of the x direction and as a function of the y direction. The value document 10 or the security element 1 is, in so doing, magnetically scanned two-dimensionally. The magnetosensitive elements 13 can be configured for detecting magnetic fields along the x or y or z direction (different sensitivity directions being possible).

Figure 3A:
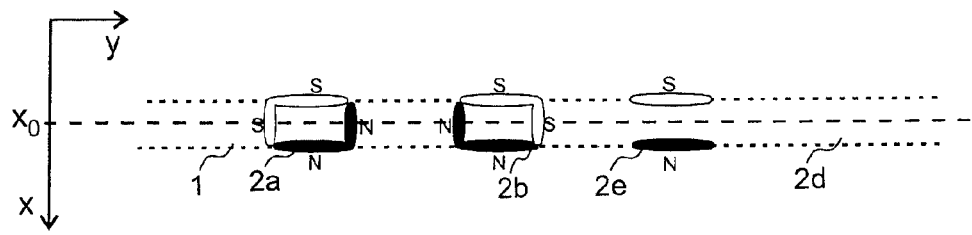

In the present example, the magnetosensitive elements 13 are configured for detecting the magnetic-field component that the coding elements 2 of the security element 1 bring about in the z direction. In FIG. 3a is represented the magnetic signal $S_z$ that the sensor line 6 detects upon magnetic scanning of the security element 1 from FIG. 2a as a function of the x and y coordinates. Positive values of the magnetic signal $S_z$ are shown black, while negative values of the magnetic signal $S_z$ are shown bordered in white. For illustration, FIG. 3a also shows the edges of the security element 1 dashed. The upper and left edges of the coding element 2a deliver a negative magnetic signal $S_z$, in accordance with the magnetic south pole present at said two edges, cf. FIG. 2b. The lower and right edges of the coding element 2a deliver a positive magnetic signal $S_z$, in accordance with the magnetic north pole present at said edges, cf. FIG. 2b. Conversely, the upper and right edges of the coding element 2b deliver a negative magnetic signal $S_z$, in accordance with the magnetic south pole present at said two edges, cf. FIG. 2b. The lower and left edges of the coding element 2b deliver a positive magnetic signal $S_z$, in accordance with the magnetic north pole present at said edges, cf. FIG. 2b. The conventional coding element 2e, in contrast, only delivers a negative magnetic signal $S_s$ (magnetic south pole) at its upper edge and a positive magnetic signal $S_z$ (magnetic north pole) at its lower edge. From the coding element 2d no, or only a negligibly small, magnetic signal $S_z$ is detected, due to the absence of remanent magnetization upon magnetization along the x direction.

Figure 3B:
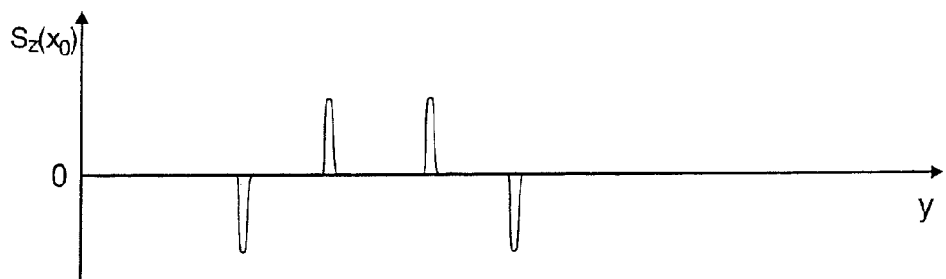

FIG. 3b indicates the course of the magnetic signal $S_z$ detected in the z direction, as a function of the position along the longitudinal direction of the security element 1 (y direction), which corresponds to the signal from FIG. 3a at the position x=x0. The position x0 is chosen here approximately in the middle of the security element 1—viewed along the magnetic-field direction x—since that is where the differences of the magnetic signal of the coding elements 2a-c are especially distinct. The magnetic signal $S_z$ of the security element has a negative peak at the left edge of the coding element 2a and at the right edge of the coding element 2b. At the right edge of the coding element 2a and at the left edge of the coding element 2b it has a positive peak. At the y coordinates of the conventional coding element 2e no magnetic signal $S_z$ at all is detected at the position x=x0, just as in the region of the coding element 2d. The two coding elements 2a and 2b hence have magnetic signals $S_z$ which are completely different from those of the conventional coding element 2e. Such magnetic signals that the grid-shaped magnetic regions of the coding elements 2a, 2b deliver cannot be generated by conventional magnetic regions of other shape or size either. The coding elements 2a and 2b having a grid-shaped magnetic region hence increase the anti-forgery security of a security element having one or more of said coding elements.

Furthermore, the two coding elements 2a and 2b are mutually distinguishable unambiguously on the basis of their different magnetic signals, cf. FIG. 3b. Such grid-shaped magnetic regions having a different grid direction can hence be advantageously employed for a magnetic coding of the security element 1 consisting of different coding elements. Thus, new basic elements for a magnetic coding are available that constitute a forgery-proof alternative to the basic elements of previous magnetic codings consisting of conventional high- and low-coercivity coding elements.

To mutually distinguish the different magnetic signals of the different coding elements, magnetosensitive elements 13 with other sensitivity directions can also be employed. The magnetic signals can also be mutually distinguished by magnetosensitive elements whose sensitivity direction lies in the plane of the security element (x-y plane), e.g. the sensitivity direction can also be parallel, oblique or perpendicular to the longitudinal direction y of the security element 1. Instead of a magnetic field $H_x$, other magnetic-field directions can also be employed for magnetization. However, the magnetic field preferably forms an acute angle with the direction of the grid strips.

Figure 5A:
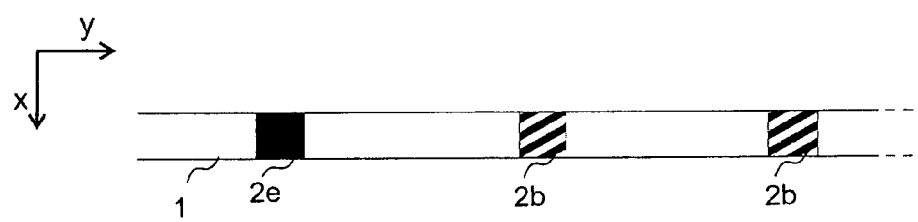

In FIG. 5a is shown a second exemplary embodiment of a security element 1 which has a conventional coding element 2e and has two coding elements 2b. The angle that the grid strips 3 of the coding elements 2b form with the longitudinal direction y of the security element 1 is an acute angle of about $\alpha=30°$.

Figure 5B:
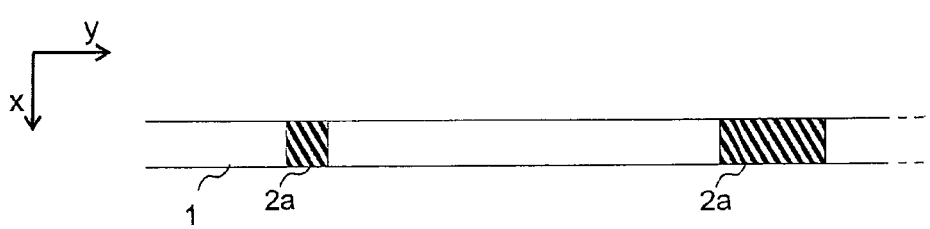

In FIG. 5b is shown a third exemplary embodiment of a security element 1 which has two coding elements 2a. The angle that the grid strips 3 of the coding elements 2a form with the longitudinal direction y of the security element 1 is an acute angle of about $\alpha=60°$.

Figure 6:
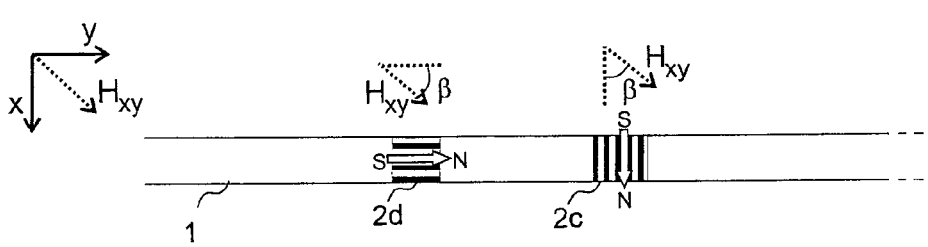
Figure 7A:
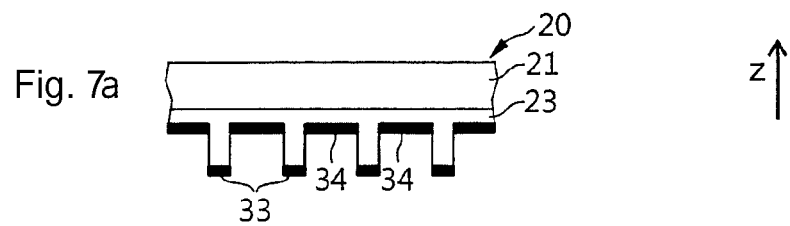
Figure 7B:
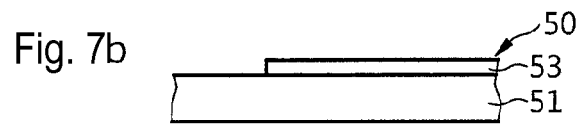
Figure 7C:
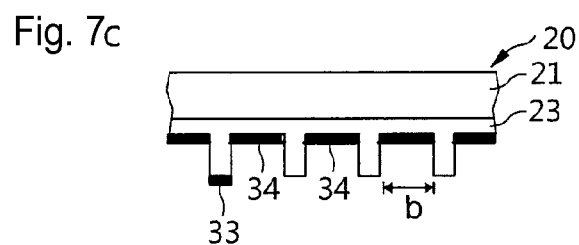
Figure 7D:
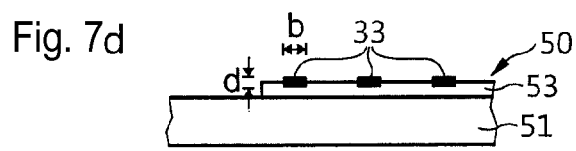
Figure 8A:
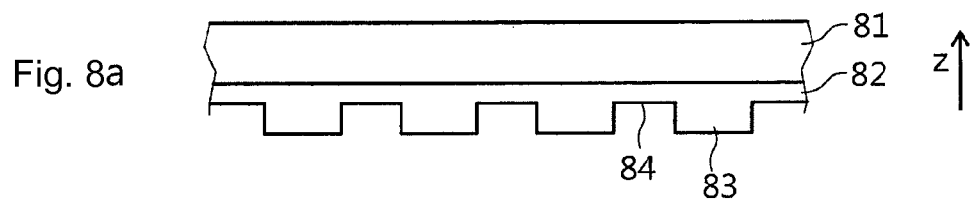
Figure 8B:
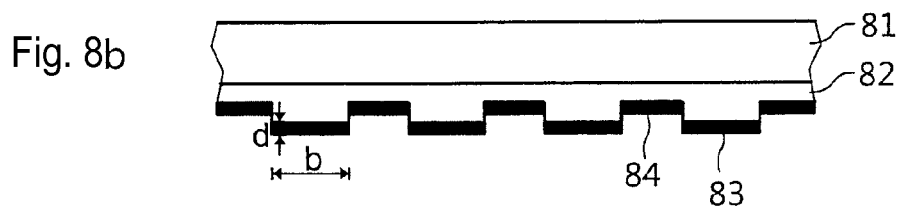

FIG. 6 shows a fourth exemplary embodiment of a security element 1 having a coding element 2d with grid strips 3 extending parallel to the longitudinal direction y of the security element 1, and a coding element 2c with grid strips 3 extending perpendicular to the longitudinal direction y of the security element 1. For magnetization, however, there is applied in this example a magnetic field $H_{xy}$ that extends obliquely to the axes x and y, e.g. at an angle of 45°. The magnetic-field angle can also deviate from 45°. The grid strips in turn enclose an acute angle $\beta$ with the applied magnetic field $H_{xy}$. Through said magnetic field $H_{xy}$ there is generated—due to the anisotropic magnetizability of the respective grid strips 3—a magnetization parallel to the y direction with the coding element 2d and a magnetization parallel to the x direction with the coding element 2c. Accordingly, the magnetic north pole N and the south pole S arise with the two coding elements on different sides of said coding elements, cf. FIG. 6. A conventional coding element 2e, in contrast, would respectively obtain a magnetic north pole on its right and lower sides and respectively a magnetic south pole on its left and upper sides. Accordingly, the magnetic signals that the two coding elements 2d and 2c deliver also differ both from each other and from that of a conventional coding element 2e.

The invention claimed is:

1. A security element for safeguarding value documents which has a magnetic coding with at least one magnetic coding element, wherein the magnetic coding element has a grid-shaped magnetic region which is formed by a plurality of mutually parallel grid strips made of magnetic material, with the grid strips of the magnetic coding element respectively having a magnetic anisotropy that is arranged to allow a magnetization direction of the magnetic coding element that differs from the direction of an applied magnetic field.

2. The security element according to claim 1, wherein the magnetic coding has at least two of the magnetic coding elements, which are arranged along a coding direction on or in the security element, with the grid strips of at least one of the coding elements extending at an acute angle to the coding direction of the security element, in particular at an angle between 20° and 70°.

3. The security element according to claim 1, wherein the magnetic coding of the security element has at least a first magnetic coding element and at least a second magnetic coding element, with the first and the second magnetic coding element being arranged along the coding direction on or in the security element, and with
   the first magnetic coding element having a grid-shaped magnetic region which is formed by a plurality of mutually parallel grid strips made of magnetic material which respectively have a magnetic anisotropy, and
   the second magnetic coding element having a grid-shaped magnetic region which is formed by a plurality of mutually parallel grid strips made of magnetic material which respectively have a magnetic anisotropy, with the grid strips of the second magnetic coding element extending in another direction than the grid strips of the first magnetic coding element.

4. The security element according to claim 3, wherein the grid strips of the second magnetic coding element extend at an angle of 60° to 120° to the grid strips of the first magnetic coding element.

5. The security element according to claim 1, wherein the width and thickness of the grid strips, in particular the width and thickness of the grid strips of the first magnetic coding element and the width and thickness of the grid strips of the second magnetic coding element, are chosen so small that the grid strips respectively have a magnetic shape anisotropy whose preferential magnetic direction extends along the grid strips.

6. The security element according to claim 1, wherein the magnetic anisotropy of the grid strips of the respective magnetic coding element, in particular of the first and the second coding element, is configured such that the respective magnetic coding element, in particular the first and the second magnetic coding element,
   has in the magnetization direction parallel to the grid strips a magnetization characteristic with an open hysteretic shape, and
   has in the magnetization direction perpendicular to the grid strips a magnetization characteristic that has a negligibly small remnant magnetization, in comparison to the magnetization characteristic in the magnetization direction parallel to the grid strips.

7. The security element according to claim 1, wherein the magnetic anisotropy of the grid strips of the respective magnetic coding element, in particular of the first and the second coding element, is configured such that
   the magnetization characteristic with the open hysteretic shape that the respective magnetic coding element has in the magnetization direction parallel to the grid strips has a coercive field strength of at least 10 Oe, and
   the magnetization characteristic that the respective magnetic coding element has in the magnetization direction perpendicular to the grid strips has a negligibly small coercive field strength, in comparison to the magnetization characteristic in the magnetization direction parallel to the grid strips.

8. A foil material having the security element according to claim 1.

9. A value document having the security element according to claim 1.

10. A method for manufacturing the security element according to claim 1, wherein the grid strips of the respective coding element, in particular of the first and the second coding element, are respectively manufactured from a magnetic coating which is applied to a substrate of the security element using a coating method.

11. The method according to claim 10, wherein, for manufacturing the grid strips, the magnetic coating is applied to a grid-shaped surface relief which was previously incorporated into a layer of the security element, in particular embossed thereinto.

12. The method according to claim 10, wherein the grid strips are manufactured by a metal transfer method, wherein
   in a layer of a first substrate a grid-shaped surface relief is manufactured and the latter is subsequently coated with magnetic material, so that magnetic regions form both on the raised places and on the depressions of the grid-shaped surface relief,
   a second substrate which is furnished with a bonding-agent layer is connected to the first substrate, so that the bonding-agent layer of the second substrate comes in contact with the magnetic regions of the first substrate which are present on the raised places of the grid-shaped surface relief,
   the first and second substrates are subsequently mutually separated again, with the magnetic material of the raised places remaining adhering to the bonding-agent layer and being detached from the first substrate, in particular from the layer of the first substrate.

13. The method according to claim 10, wherein the magnetic coating is applied to a substrate of the security element, and the applied magnetic coating is subsequently removed in the intermediate regions of the grid strips, in particular by etching or by means of a washing-ink method or by means of a photoresist lift-off method or by irradiation with a laser.

14. The method according to claim 10, wherein a magnetic coating is applied to a substrate of the security element, and that the grid strips of the coding element are manufactured by embossing the magnetic coating.

15. A method for checking a value document which has a security element according to claim 1, using a magnetic sensor which detects magnetic signals of the security element, wherein, for magnetizing the magnetic coding elements, there acts on the security element before and/or during the detection of the magnetic signals a magnetic field whose direction extends at an acute angle to the grid strips of at least one of the magnetic coding elements.

* * * * *